(12) United States Patent
Otremba et al.

(10) Patent No.: US 12,707,989 B2
(45) Date of Patent: Aug. 11, 2026

(54) POWER SEMICONDUCTOR PACKAGE AND METHOD FOR FABRICATING THE SAME

(71) Applicant: Infineon Technologies Austria AG, Villach (AT)

(72) Inventors: Ralf Otremba, Kaufbeuren (DE); Thai Kee Gan, Melaka (MY); Teck Sim Lee, Melaka (MY); Chwee Pang Tommy Khoo, Melaka (MY); Christian Schiele, Munich (DE); Katrin Unterhofer, Munich (DE); Patrick Uredat, Munich (DE)

(73) Assignee: Infineon Technologies Austria AG, Villach (AT)

( * ) Notice: Subject to any disclaimer, the term of this patent is extended or adjusted under 35 U.S.C. 154(b) by 421 days.

(21) Appl. No.: 18/453,639

(22) Filed: Aug. 22, 2023

(65) Prior Publication Data

US 2024/0087995 A1 Mar. 14, 2024

(30) Foreign Application Priority Data

Sep. 12, 2022 (DE) ......................... 102022209470.0

(51) Int. Cl.
*H10W 70/40* (2026.01)
*H10W 72/00* (2026.01)
(Continued)

(52) U.S. Cl.
CPC ....... *H10W 70/429* (2026.01); *H10W 70/481* (2026.01); *H10W 90/00* (2026.01);
(Continued)

(58) Field of Classification Search
CPC ............. H10W 90/811; H10W 90/753; H10W 90/757; H10W 90/00; H10W 90/10;
(Continued)

(56) References Cited

U.S. PATENT DOCUMENTS

2004/0248330 A1 12/2004 Kitabatake et al.
2018/0096961 A1* 4/2018 Hashizume ......... H10W 70/457
(Continued)

FOREIGN PATENT DOCUMENTS

CN 102074538 A * 5/2011 .......... H10W 70/481
CN 110890336 A * 3/2020 .......... H10W 70/461
(Continued)

*Primary Examiner* — David A Zarneke
(74) *Attorney, Agent, or Firm* — Murphy, Bilak & Homiller, PLLC

(57) ABSTRACT

A power semiconductor package includes: a die carrier having first and second opposite sides; and first and second power semiconductor dies each having first and second power electrodes on opposite sides. The second power electrodes face and are electrically coupled to the first side of the carrier. A molded body at least partially encapsulates the dies and has a first and second opposite sides and lateral sides connecting the first and second sides. First and second power contacts and first and second control contacts are arranged laterally next to each other. The first power electrode of the first die is electrically coupled to the first power contact by a first electrical connector. The first power electrode of the second die is electrically coupled to the second power contact by a second electrical connector. A width of each power contact is at least four times the width of each control contact.

17 Claims, 4 Drawing Sheets

(51) Int. Cl.
*H10W 72/50* (2026.01)
*H10W 90/00* (2026.01)

(52) U.S. Cl.
CPC .... *H10W 90/811* (2026.01); *H10W 72/07552* (2026.01); *H10W 72/527* (2026.01); *H10W 90/753* (2026.01); *H10W 90/756* (2026.01)

(58) Field of Classification Search
CPC ... H10W 90/465; H10W 70/481; H10W 8/00; H10W 48/00
See application file for complete search history.

(56) References Cited

U.S. PATENT DOCUMENTS

| | | | | |
|---|---|---|---|---|
| 2023/0032828 | A1* | 2/2023 | Fu | H10W 70/481 |
| 2023/0215811 | A1* | 7/2023 | Tang | H10W 42/20<br>257/659 |
| 2024/0087995 | A1* | 3/2024 | Otremba | H10W 70/429 |

FOREIGN PATENT DOCUMENTS

| | | | | | |
|---|---|---|---|---|---|
| CN | 217426736 | U | * | 9/2022 | |
| CN | 218123390 | U | * | 12/2022 | |
| DE | 102017103476 | A1 | | 6/2018 | |
| WO | WO-2022226142 | A1 | * | 10/2022 | H10W 70/658 |

* cited by examiner

POWER SEMICONDUCTOR PACKAGE AND METHOD FOR FABRICATING THE SAME

TECHNICAL FIELD

This disclosure relates in general to a power semiconductor package, as well as to a method for fabricating a power semiconductor package.

BACKGROUND

In high power applications, power modules may be used to e.g. provide converter circuitry, inverter circuitry, etc. However, power modules may have to be adapted to each specific application which may increase the costs and/or reduce flexibility if the requirements are modified. Discrete power semiconductor packages may be used as an alternative for power modules. The use of power semiconductor packages instead of power modules may provide a cost optimization and/or an improved performance on a system level. In order to be able to replace power modules, power semiconductor packages may have to be configured to operate with high electrical currents and/or high voltages. Improved power semiconductor packages as well as improved methods for fabricating power semiconductor packages may help with solving these and other problems.

The problem on which the invention is based is solved by the features of the independent claims. Further advantageous examples are described in the dependent claims.

SUMMARY

Various aspects pertain to a power semiconductor package comprising a die carrier comprising a first side and an opposite second side, at least a first and a second power semiconductor die each comprising a first power electrode on a first side and a second power electrode on an opposite second side, wherein the second power electrodes face the first side of the die carrier and are electrically coupled to the first side of the die carrier, a molded body at least partially encapsulating the first and second power semiconductor dies, the molded body comprising a first side, an opposite second side and lateral sides connecting the first and second sides, wherein the second side of the die carrier is at least partially exposed from the second side of the molded body, at least a first and a second power contact and at least a first and a second control contact, the power contacts and control contacts arranged laterally next to each other and exposed from a first one of the lateral sides of the molded body, wherein the first power electrode of the first power semiconductor die is electrically coupled to the first power contact by a first electrical connector and the first power electrode of the second power semiconductor die is electrically coupled to the second power contact by a second electrical connector, and wherein a width of each of the power contacts is at least four times the width of each of the control contacts.

Various aspects pertain to a power semiconductor package comprising a die carrier comprising a first side and an opposite second side, a plurality of power semiconductor dies electrically coupled in parallel to each other by the die carrier, the power semiconductor dies each comprising a first power electrode on a first side and a second power electrode on an opposite second side, wherein the second power electrodes face the first side of the die carrier, a molded body at least partially encapsulating the power semiconductor dies, the molded body comprising a first side, an opposite second side and lateral sides connecting the first and second sides, wherein the second side of the die carrier is at least partially exposed from the second side of the molded body, at least a first and a second power contact and at least a first and a second control contact, the power contacts and control contacts arranged laterally next to each other and exposed from a first one of the lateral sides of the molded body, wherein the first power electrode of each of the power semiconductor dies is electrically coupled to the first or second power contact by an electrical connector, and wherein a width of each of the power contacts is at least four times the width of each of the control contacts.

Various aspects pertain to a method for fabricating a power semiconductor package, the method comprising: providing a die carrier comprising a first side and an opposite second side, arranging at least a first and a second power semiconductor die over the die carrier, the first and second power semiconductor dies each comprising a first power electrode on a first side and a second power electrode on an opposite second side, such that the second power electrodes face the first side of the die carrier and are electrically coupled to the first side of the die carrier, at least partially encapsulating the first and second power semiconductor dies in a molded body, the molded body comprising a first side, an opposite second side and lateral sides connecting the first and second sides, such that the second side of the die carrier is at least partially exposed from the second side of the molded body, providing at least a first and a second power contact and at least a first and a second control contact such that the power contacts and control contacts are arranged laterally next to each other and such that the power contacts and control contacts are exposed from a first one of the lateral sides of the molded body, electrically coupling the first power electrode of the first power semiconductor die to the first power contact using a first electrical connector and electrically coupling the first power electrode of the second power semiconductor die to the second power contact using a second electrical connector, wherein a width of each of the power contacts is at least four times the width of each of the control contacts.

BRIEF DESCRIPTION OF THE DRAWINGS

The accompanying drawings illustrate examples and together with the description serve to explain principles of the disclosure. Other examples and many of the intended advantages of the disclosure will be readily appreciated in view of the following detailed description. The elements of the drawings are not necessarily to scale relative to each other. Identical reference numerals designate corresponding similar parts.

DETAILED DESCRIPTION

In the following detailed description, directional terminology, such as "top", "bottom", "left", "right", "upper", "lower" etc., is used with reference to the orientation of the Figure(s) being described. Because components of the disclosure can be positioned in a number of different orientations, the directional terminology is used for purposes of illustration only. It is to be understood that other examples may be utilized and structural or logical changes may be made.

In addition, while a particular feature or aspect of an example may be disclosed with respect to only one of several implementations, such feature or aspect may be combined with one or more other features or aspects of the other implementations as may be desired and advantageous for any given or particular application, unless specifically noted otherwise or unless technically restricted. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives thereof may be used. It should be understood that these terms may be used to indicate that two elements cooperate or interact with each other regardless of whether they are in direct physical or electrical contact, or they are not in direct contact with each other; intervening elements or layers may be provided between the "bonded", "attached", or "connected" elements. However, it is also possible that the "bonded", "attached", or "connected" elements are in direct contact with each other. Also, the term "exemplary" is merely meant as an example, rather than the best or optimal.

The semiconductor dies can be manufactured from a specific semiconductor material, for example Si, SiC, SiGe, GaAs, GaN, or from any other suitable semiconductor material.

An efficient power semiconductor module as well as an efficient method for fabricating a power semiconductor module may for example reduce material consumption, ohmic losses, chemical waste, etc. and may thus enable energy and/or resource savings. Improved power semiconductor packages and improved methods for fabricating power semiconductor packages, as specified in this description, may thus at least indirectly contribute to green technology solutions, i.e. climate-friendly solutions providing a mitigation of energy and/or resource use.

Figure 1:
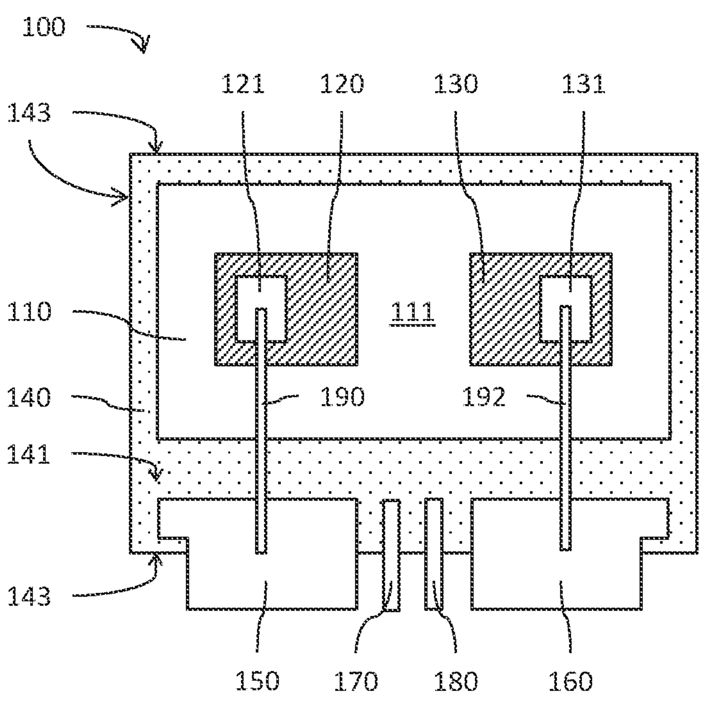
FIG. 1 shows a plan view onto a first side of a power semiconductor package, wherein the power semiconductor package comprises power contacts and control contacts. A width of each of the power contacts is at least four times the width of each of the control contacts. Note that in order to show the interior of the package, the molded body of the power semiconductor package is transparent in FIG. 1.

FIG. 1 shows a power semiconductor package 100 comprising a die carrier 110, a first power semiconductor die 120, a second power semiconductor die 130, a molded body 140, a first power contact 150, a second power contact 160, a first control contact 170 and a second control contact 180.

The power semiconductor package 100 may be configured to operate with a high voltage and/or a strong electrical current. The power semiconductor package 100 may comprise any suitable electrical circuit, e.g. a half bridge circuit, a full bridge circuit, an inverter circuit, a converter circuit, etc. According to an example, the semiconductor package 100 is a surface mounted device (SMD). According to another example, the semiconductor package 100 is a through hole device (THD). The power semiconductor package 100 may for example be configured for use in automotive applications.

The die carrier 110 comprises a first side 111 and an opposite second side 112. The die carrier 110 may comprise or consist of any suitable metal or metal alloy. The die carrier 110 may for example comprise or consist of Al, Cu or Fe. According to an example, the die carrier 110 is a leadframe part. According to an example, no dielectric layer is arranged between the first side 111 and the second side 112 of the die carrier 110. In other words, power semiconductor dies 120, 130 that are coupled to the first side 111 of the die carrier 110 may be electrically contacted at the second side 112 of the die carrier 110.

In the example shown in FIG. 1, the power semiconductor package 100 comprises a single die carrier 110 and corresponding power and control contacts 150-180. It is however also possible that the power semiconductor package comprises two or more die carriers 110 and additional corresponding power and control contacts. The more than one die carriers may for example be arranged laterally next to each other.

The first power semiconductor die 120 and the second power semiconductor die 130 each comprise a first power electrode 121, 131 on a first side and a second power electrode (not visible in FIG. 1) on an opposite second side. The second power electrodes face the first side 111 of the die carrier 110 and are electrically coupled to the first side 111 of the die carrier 110.

The first and second power semiconductor dies 120, 130 may be identical dies. However, it is also possible that the power semiconductor dies 120, 130 have different dimensions and/or are different types of dies. Furthermore, the power semiconductor package 100 may comprise further semiconductor dies, for example further power semiconductor dies. The further semiconductor dies may for example be arranged on and electrically coupled to the die carrier 110, similar to the power semiconductor dies 120, 130.

The molded body 140 at least partially encapsulates the first and second power semiconductor dies 120, 130. The power semiconductor dies 120, 130 may in particular be encapsulated by the molded body 140 on all sides except for the second sides which face the die carrier 110.

The molded body 140 comprises a first side 141, an opposite second side 142 and lateral sides 143 connecting the first and second sides 141, 142. The second side 112 of the die carrier 110 is at least partially exposed from the second side 142 of the molded body 140. In this context, "at least partially exposed" may mean that 50% or more, or 70% or more, or 90% or more, or 100% of the surface area of the second side 112 of the die carrier 110 is exposed from the second side 142 of the molded body 140. The first side 111 of the die carrier 110 may be completely encapsulated by the molded body 140 (except for those parts that are covered by the power semiconductor dies 120, 130).

The molded body 140 may for example be fabricated using injection molding, compression molding or transfer molding. The molded body 140 may comprise or consist of any suitable mold material. According to an example, the molded body 140 comprises filler particles, e.g. inorganic filler particles configured to reduce the thermal resistance of the molded body 140.

The first power contact 150, the second power contact 160, the first control contact 170 and the second control contact 180 are arranged laterally next to each other. The power and control contacts 150-180 may for example all be arranged along and exposed from a first one of the lateral sides 143 of the molded body 140. According to an example, further contacts of the power semiconductor package 100, e.g. further power contacts, may be arranged along and exposed from one or more of the remaining lateral sides 143 of the molded body 140.

The power and control contacts 150-180, in particular the ends of the power and control contacts 150-180, may be coplanar to each other (e.g. to enable surface mounting of the power semiconductor package 100). The power and control contacts 150-180 may have any suitable shape, for example a gull wing shape. However, it is for example also possible that the power and control contacts 150-180 are bent downwards in order to allow insertion into through holes.

The first power electrode 121 of the first power semiconductor die 120 is electrically coupled to the first power contact 150 by a first electrical connector 190. The first power electrode 131 of the second power semiconductor die 130 is electrically coupled to the second power contact 160 by a second electrical connector 192. The first and second electrical connectors 190, 192 may for example comprise or consist of bond wires, ribbons, contact clips or any other suitable connector structure. The first and second electrical connectors 190, 192 may be soldered onto the first power electrodes 121, 131 and/or onto the power contacts 150, 160. The electrical connectors 190, 192 may be encapsulated by the molded body 140. According to an example, more than a single first electrical connector 190 and more than a single second electrical connector 192 are used to couple the respective power electrode 121, 131 to the respective power contact 150, 160.

The first power electrodes 121, 131 may for example comprise one or more of a source electrode, a drain electrode, an emitter electrode, or a collector electrode.

According to an example, an entire length of the first electrical connector 190 extends along a first straight line and an entire length of the second electrical connector 192 extends along a second straight line, wherein the first and second straight lines are parallel to each other (compare FIG. 1). Such an arrangement may help with minimizing the required length of the electrical connectors 190, 192 which in turn may improve the electrical performance of the power semiconductor package 100.

A width $w_1$ of each of the first and second power contacts 150, 160 is at least four times the width $w_2$ of each of the control contacts 170, 180. The width of the power and control contacts 150-180 may be measured parallel to the first side 111 of the die carrier 110 and parallel to the first one of the lateral sides 143 of the molded body 140 (wherein the contacts 150-180 are arranged along this lateral side 143). The increased width of the power contacts 150, 160 compared to the width of the control contacts 170, 180 may increase the current carrying capacity of the power contacts 150, 160.

According to an example, the width $w_1$ of each of the first and second power contacts 150, 160 may be at least five times, or at least six times, or at least seven times, or at least eight times the width $w_2$ of each of the control contacts 170, 180.

The first power contact 150 and the second power contact 160 may have the same width $w_1$ or the width of the first and second power contacts 150, 160 may differ (in the latter case, each of the power contacts 150, 160 may still be at least four times wider than each of the control contacts 170, 180).

The width $w_1$ of the first and second power contacts 150, 160 may for example be 3 mm or more, or 4 mm or more, or 6 mm or more, or 8 mm or more, or 1 cm or more.

The power contacts 150, 160 and the control contacts 170, 180 may for example have the same thickness, wherein the thickness is measured perpendicular to the first side 111 of the die carrier 110. The contacts 150-180 may for example have the same thickness as the die carrier 110.

The power contacts 150, 160 and the control contacts 170, 180 may have the same length, wherein the length is measured perpendicular to the first one of the lateral sides 143 of the molded body 140.

The power contacts 150, 160 may have at least the width $w_1$ along their entire length. However, it is also possible that the power contacts 150, 160 have a reduced width along some part of their length. The part with the reduced width may for example be 30% or less, or 20% or less, or 10% or less, or 5% or less of the length of the power contacts 150, 160. In a similar fashion, the control contacts 170, 180 may have the at maximum the width $w_2$ along their entire length, or the control contacts 170, 180 may have an increased width in a part that is 30% or less, or 20% or less, or 10% or less, or 5% or less of the length of the control contacts 170, 180.

According to an example, the control contacts are coupled to control electrodes of the power semiconductor dies 120, 130 (not shown in FIG. 1). The first control contact 170 may be coupled to a control electrode of the first power semiconductor die 120 and the second control contact 180 may be coupled to a control electrode of the second power semiconductor die 130. The control electrodes may for example be gate electrodes. The control contacts 170, 180 may for example be coupled to the control electrodes using wire bonds (not shown in FIG. 1).

Figure 2:
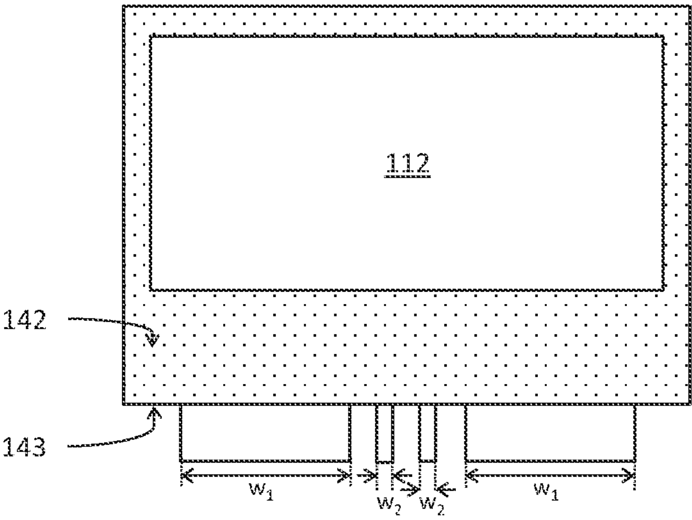
FIG. 2 shows a plan view onto a second side of the power semiconductor package of FIG. 1, wherein the second side is opposite the first side. Note that the molded body is opaque in FIG. 2.

FIG. 2 shows a plan view onto a side of the power semiconductor package 100 which comprises the second side 142 of the molded body 140 and the second side 112 of the die carrier 110. Note that in FIG. 1 the molded body 140 is transparent in order to show the interior of the power semiconductor package 100, whereas in FIG. 2 the molded body 140 is not transparent.

As shown in FIG. 2, the second side 112 of the die carrier 110 is at least partially exposed from the second side 142 of the molded body 140. The second sides 112, 142 may essentially be coplanar. However, it is also possible that there is a step between the second sides 112, 142.

According to an example, the second side 112 of the die carrier 110 is configured to be connected to a heatsink. According to another example, the second side 112 is configured as a power contact of the power semiconductor package 100. The power contact may for example be a drain contact, a source contact, an emitter contact or a collector contact.

In the case that the power semiconductor package 100 comprises more than one die carrier 110, the second sides 112 of the more than one die carriers 110 may be exposed from the second side 142 of the molded body 140 and may be arranged laterally next to each other.

Figure 3A:
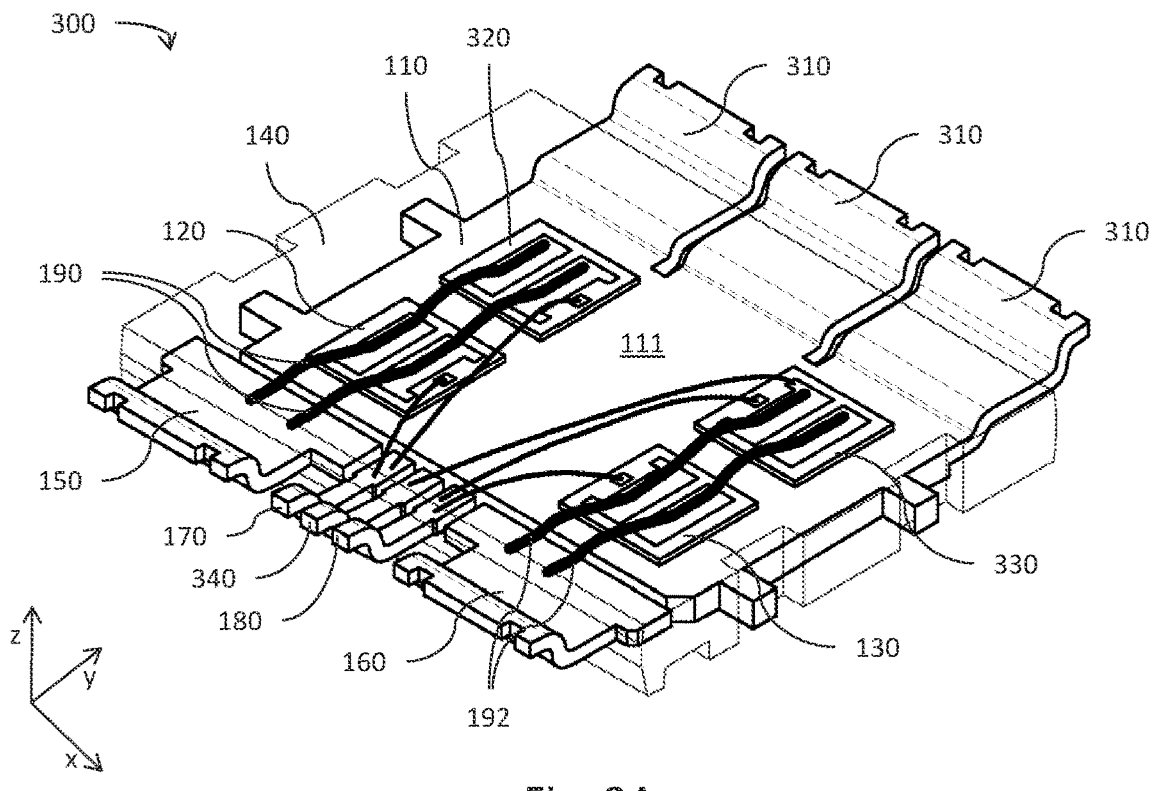
FIGS. 3A to 3C show perspective views of further power semiconductor packages with different arrangements of power semiconductor dies.
Figure 3B:
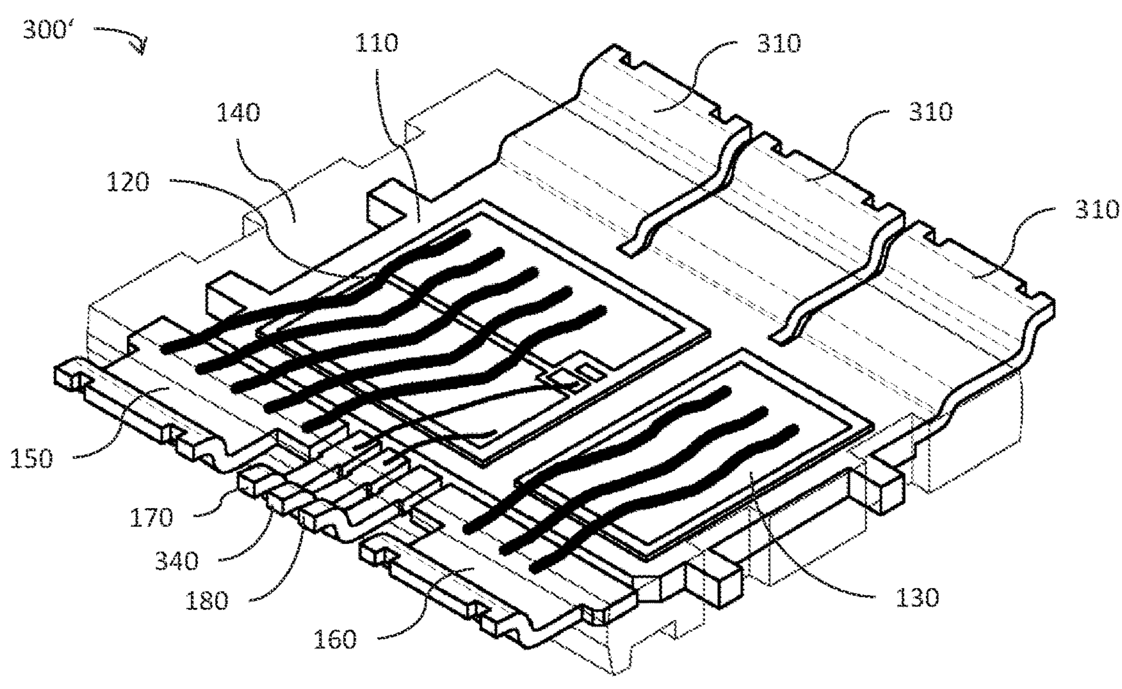
Figure 3C:
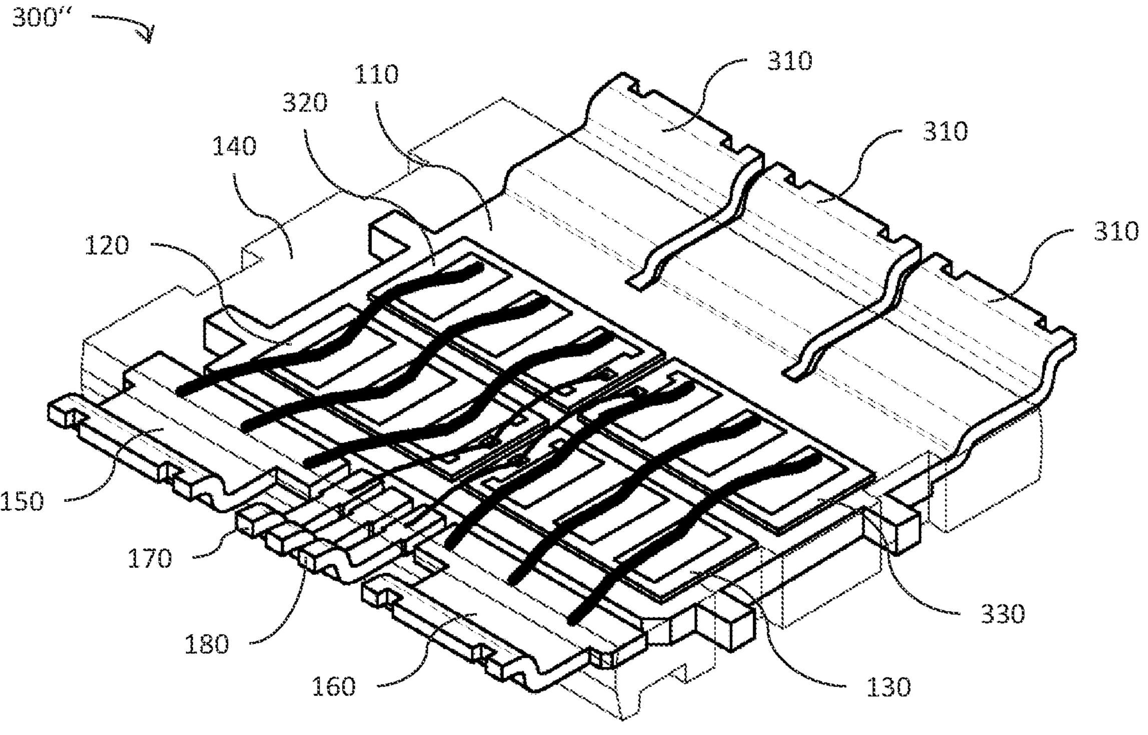

FIGS. 3A to 3C show perspective views of further power semiconductor packages 300, 300' and 300". The power semiconductor packages 300, 300' and 300" may be similar or identical to the power semiconductor package 100, except for the differences described in the following.

The power semiconductor packages 300 to 300" may comprise all parts described with respect to the power semiconductor package 100 and it may furthermore comprise one or more further power contacts 310, for example a third and a fourth and possibly also a fifth power contact 310. The one or more further power contacts 310 may be contiguous with the die carrier 110. In this context, “contiguous” may mean that the die carrier 110 and the one or more further power contacts 310 are one monolithic part. By using several further power contacts 310 instead of a single further power contact 310 with increased width, the flexural rigidity of the further power contacts 310 may be comparatively lower. This may be beneficial during fabrication when the further power contacts 310 are bent into shape.

The power semiconductor package 300 shown in FIG. 3A may for example comprise a third power semiconductor die 320 and a fourth power semiconductor die 330. A first power electrode of the third power semiconductor die 320 is electrically coupled to the first power contact 150 by the first electrical connector 190 and a first power electrode of the fourth power semiconductor die 330 is electrically coupled to the second power contact 160 by the second electrical connector 192. In other words, the first electrical connector 190 may be coupled to the first power electrodes of the first and the third power semiconductor dies 120, 320 and the second electrical connector 192 may be coupled to the first power electrodes of the second and the fourth power semiconductor dies 130, 330.

As shown in FIG. 3A, the power semiconductor package 300 may comprise more than one first electrical connectors 190 and more than one second electrical connectors 192.

The first control contact 170 may be coupled to control electrodes of the first and third power semiconductor dies 120, 320 and the second control contact 180 may be coupled to control electrodes of the second and fourth power semiconductor dies 130, 330. The control contacts 170, 180 may e.g. be coupled to the control electrodes using bond wires (these bond wires may have a smaller diameter than the electrical connectors 190, 192, for example half the diameter of the electrical connectors 190, 192).

The power semiconductor package 300 may further comprise a sensing contact 340. The sensing contact 340 may for example be arranged between the first and second control contacts 170, 180. The sensing contact 340 may be coupled to the first power electrode of one of the power semiconductor dies 120, 130, 320, 330, for example to the first power electrode of the fourth power semiconductor die 330.

According to an example, the power semiconductor dies 120, 130, 320, 330 are arranged on the die carrier 110 in a symmetrical matrix. The first side 111 of the die carrier 110 may for example be arranged in the xy-plane, wherein rows of power semiconductor dies are arranged parallel to the x-axis and columns of power semiconductor dies are arranged parallel to the y-axis. According to an example, the electrical connectors 190, 192 are parallel to the y-axis.

The power semiconductor package 300' shown in FIG. 3B comprises the first power semiconductor die 120 and the second power semiconductor die 130. However, in the power semiconductor package 300', the first and second semiconductor dies 120, 130 are different types of dies and/or have different dimensions.

According to an example, the first power semiconductor die 120 is a power transistor die, e.g. a MOSFET or an IGBT. The second power semiconductor die 130 may for example be a power diode.

The semiconductor package 300" shown in FIG. 3C may for example comprise the power semiconductor dies 120, 130, 320, 330. The power semiconductor dies 120, 130, 320, 330 may for example comprise or consist of SiC. As shown in FIG. 3C, the power semiconductor dies 120, 130, 320, 330 may be arranged in a symmetrical matrix on the die carrier 110.

According to an example, the power semiconductor package 300" comprises a dummy contact arranged between the control contacts 170, 180, wherein the dummy contact is not electrically coupled to any other component of the power semiconductor package 300".

As shown in FIGS. 3A-3C, the power semiconductor packages 300, 300' and 300" may comprise different semiconductor dies or different numbers of semiconductor dies. However, the semiconductor packages 300, 300' and 300" may nonetheless have the same outer shape and/or the same dimensions and/or the same number of contacts and/or the same arrangement of the contacts and/or the same die carrier 110 and/or the same molded body 140. In other words, the same package may be used for different applications, reducing fabrication complexity and/or saving costs.

Figure 4:
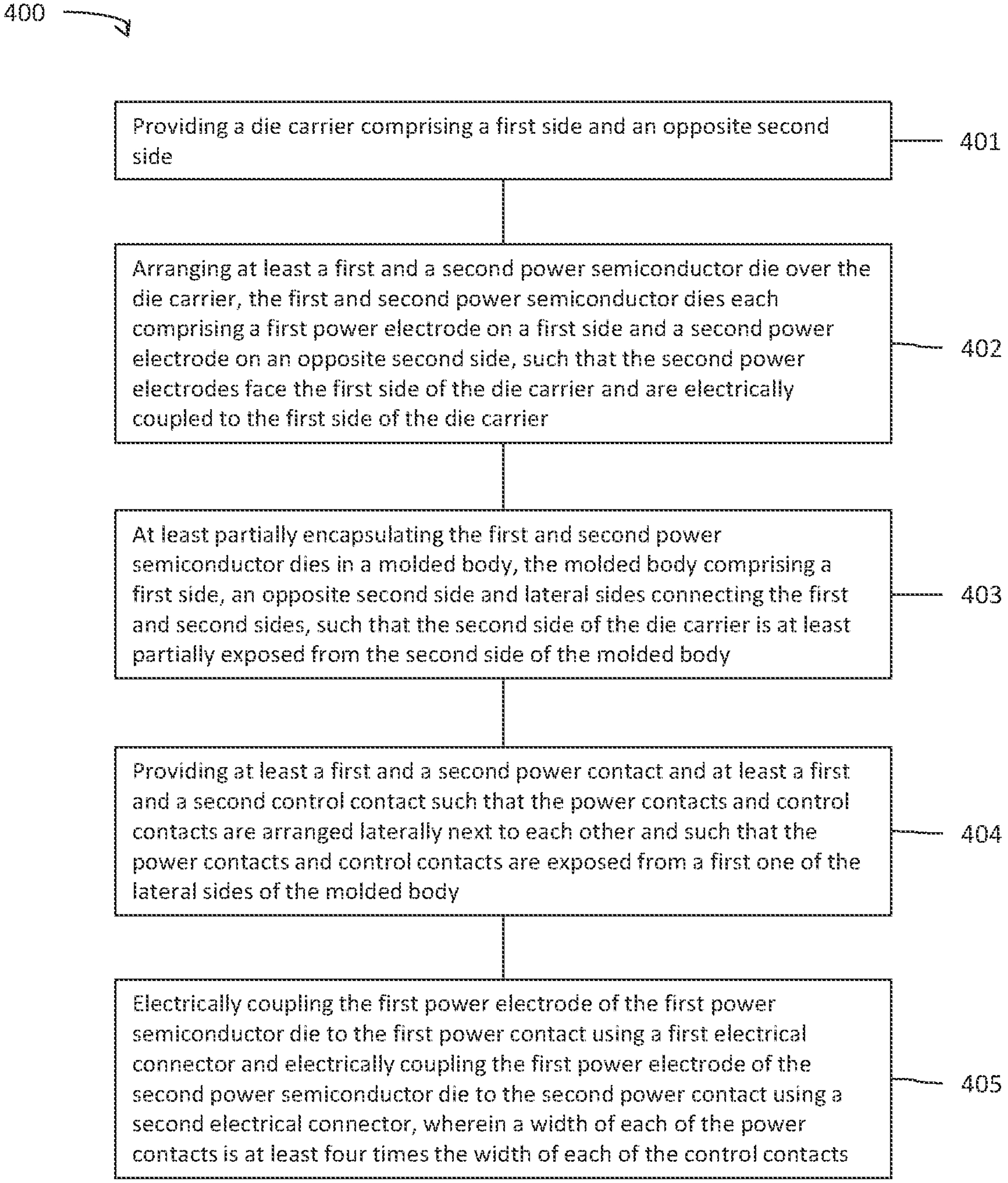
FIG. 4 is a flow chart of an exemplary method for fabricating a power semiconductor package.

FIG. 4 is a flow chart of a method 400 for fabricating a power semiconductor package. The method 400 may for example be used to fabricate the power semiconductor packages 100 to 300".

The method 400 comprises at 401 a process of providing a die carrier comprising a first side and an opposite second side, at 402 a process of arranging at least a first and a second power semiconductor die over the die carrier, the first and second power semiconductor dies each comprising a first power electrode on a first side and a second power electrode on an opposite second side, such that the second power electrodes face the first side of the die carrier and are electrically coupled to the first side of the die carrier, at 403 a process of at least partially encapsulating the first and second power semiconductor dies in a molded body, the molded body comprising a first side, an opposite second side and lateral sides connecting the first and second sides, such that the second side of the die carrier is at least partially exposed from the second side of the molded body, at 404 a process of providing at least a first and a second power contact and at least a first and a second control contact such that the power contacts and control contacts are arranged laterally next to each other and such that the power contacts and control contacts are exposed from a first one of the lateral sides of the molded body, and at 405 a process of electrically coupling the first power electrode of the first power semiconductor die to the first power contact using a first electrical connector and electrically coupling the first power electrode of the second power semiconductor die to the second power contact using a second electrical connector, wherein a width of each of the power contacts is at least four times the width of each of the control contacts.

According to an example, the method 400 further comprises a process of providing a third and a fourth power semiconductor die and a process of electrically coupling a first power electrode of the third power semiconductor die to the first power contact using the first electrical connector and electrically coupling a first power electrode of the fourth power semiconductor die to the second power contact using the second electrical connector.

In the following, the power semiconductor package, as well as the method for fabricating a power semiconductor package, are further explained using specific examples.

Example 1 is a power semiconductor package, comprising: a die carrier comprising a first side and an opposite second side, at least a first and a second power semiconductor die each comprising a first power electrode on a first side and a second power electrode on an opposite second side, wherein the second power electrodes face the first side of the die carrier and are electrically coupled to the first side of the die carrier, a molded body at least partially encapsulating the first and second power semiconductor dies, the molded body comprising a first side, an opposite second side and lateral sides connecting the first and second sides, wherein the second side of the die carrier is at least partially exposed from the second side of the molded body, at least a first and a second power contact and at least a first and a second control contact, the power contacts and control contacts arranged laterally next to each other and exposed from a first one of the lateral sides of the molded body, wherein the first power electrode of the first power semiconductor die is electrically coupled to the first power contact by a first electrical connector and the first power electrode of the second power semiconductor die is electrically coupled to the second power contact by a second electrical connector, and wherein a width of each of the power contacts is at least four times the width of each of the control contacts.

Example 2 is the power semiconductor package of example 1, wherein the die carrier, the power contacts and the control contacts are all leadframe parts.

Example 3 is the power semiconductor package of example 1 or 2, further comprising: at least a third and a fourth power contact exposed from the molded body at a second one of the lateral sides, the second lateral side being opposite the first lateral side, wherein the third and fourth power contacts are contiguous with the die carrier.

Example 4 is the power semiconductor package of one of the preceding examples, wherein the first side of the molded body is configured to be arranged over an application board.

Example 5 is the power semiconductor package of one of the preceding examples, wherein the second side of the molded body is configured to be coupled to a heatsink.

Example 6 is the power semiconductor package of one of the preceding examples, wherein the control contacts are arranged between the first power contact and second power contact.

Example 7 is the power semiconductor package of one of the preceding examples, further comprising: a third and a fourth power semiconductor die, wherein a first power electrode of the third power semiconductor die is electrically coupled to the first power contact by the first electrical connector and a first power electrode of the fourth power semiconductor die is electrically coupled to the second power contact by the second electrical connector.

Example 8 is the power semiconductor package of example 7, wherein the first control contact is coupled to a gate electrode of the first power semiconductor die and to a gate electrode of the third power semiconductor die and the second control contact is coupled to a gate electrode of the second power semiconductor die and to a gate electrode of the fourth power semiconductor die.

Example 9 is the power semiconductor package of example 7 or 8, further comprising: a sensing contact arranged between the first and second control contacts, wherein the sensing contact is coupled to the first power electrode of the fourth power semiconductor die.

Example 10 is the power semiconductor package of one of examples 7 to 9, wherein in a projection from above the first side of the power semiconductor dies, an entire length of the first electrical connector extends along a first straight line and an entire length of the second electrical connector extends along a second straight line, wherein the first and second straight lines are parallel to each other.

Example 11 is the power semiconductor package of one of the preceding examples, wherein the first and second electrical connectors comprise or consist of one or more of wire bonds, ribbons and contact clips.

Example 12 is a power semiconductor package, comprising: a die carrier comprising a first side and an opposite second side, a plurality of power semiconductor dies electrically coupled in parallel to each other by the die carrier, the power semiconductor dies each comprising a first power electrode on a first side and a second power electrode on an opposite second side, wherein the second power electrodes face the first side of the die carrier, a molded body at least partially encapsulating the power semiconductor dies, the molded body comprising a first side, an opposite second side and lateral sides connecting the first and second sides, wherein the second side of the die carrier is at least partially exposed from the second side of the molded body, at least a first and a second power contact and at least a first and a second control contact, the power contacts and control contacts arranged laterally next to each other and exposed from a first one of the lateral sides of the molded body, wherein the first power electrode of each of the power semiconductor dies is electrically coupled to the first or second power contact by an electrical connector, and wherein a width of each of the power contacts is at least four times the width of each of the control contacts.

Example 13 is the power semiconductor package of example 12, wherein the power semiconductor dies are arranged on the die carrier in a symmetrical matrix.

Example 14 is a method for fabricating a power semiconductor package, the method comprising: providing a die carrier comprising a first side and an opposite second side, arranging at least a first and a second power semiconductor die over the die carrier, the first and second power semiconductor dies each comprising a first power electrode on a first side and a second power electrode on an opposite second side, such that the second power electrodes face the first side of the die carrier and are electrically coupled to the first side of the die carrier, at least partially encapsulating the first and second power semiconductor dies in a molded body, the molded body comprising a first side, an opposite second side and lateral sides connecting the first and second sides, such that the second side of the die carrier is at least partially exposed from the second side of the molded body, providing at least a first and a second power contact and at least a first and a second control contact such that the power contacts and control contacts are arranged laterally next to each other and such that the power contacts and control contacts are exposed from a first one of the lateral sides of the molded body, electrically coupling the first power electrode of the first power semiconductor die to the first power contact using a first electrical connector and electrically coupling the first power electrode of the second power semiconductor die to the second power contact using a second electrical connector, and wherein a width of each of the power contacts is at least four times the width of each of the control contacts.

Example 15 is the method of example 14, further comprising: providing a third and a fourth power semiconductor die, and electrically coupling a first power electrode of the third power semiconductor die to the first power contact using the first electrical connector and electrically coupling a first power electrode of the fourth power semiconductor die to the second power contact using the second electrical connector.

Example 16 is the method of example 14 or 15, wherein in a projection from above the first side of the power semiconductor dies, an entire length of the first electrical connector extends along a first straight line and an entire length of the second electrical connector extends along a second straight line, wherein the first and second straight lines are parallel to each other.

Example 17 is the method of one of examples 14 to 16, further comprising: providing at least a third and a fourth power contact exposed from the molded body at a second one of the lateral sides, the second lateral side being opposite the first lateral side, wherein the third and fourth power contacts are contiguous with the die carrier.

Example 18 is an apparatus comprising means for performing the method according to anyone of examples 14 to 17.

While the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure.

What is claimed is:

1. A power semiconductor package, comprising:

a die carrier comprising a first side and an opposite second side;

at least a first and a second power semiconductor die each comprising a first power electrode on a first side and a second power electrode on an opposite second side, wherein the second power electrodes face the first side of the die carrier and are electrically coupled to the first side of the die carrier;

a molded body at least partially encapsulating the first and second power semiconductor dies, the molded body comprising a first side, an opposite second side, and lateral sides connecting the first and second sides, wherein the second side of the die carrier is at least partially exposed from the second side of the molded body;

a first and a second power contact and a first and a second control contact, the first and second power contacts and the first and second control contacts arranged laterally next to each other and exposed from a first one of the lateral sides of the molded body, wherein the first power electrode of the first power semiconductor die is electrically coupled to the first power contact by a first electrical connector, wherein the first power electrode of the second power semiconductor die is electrically coupled to the second power contact by a second electrical connector, and wherein a width of each of the first and second power contacts is at least four times the width of each of the first and second control contacts.

2. The power semiconductor package of claim 1, wherein the die carrier, the first and second power contacts, and the first and second control contacts are all leadframe parts.

3. The power semiconductor package of claim 1, further comprising:

a third and a fourth power contact exposed from the molded body at a second one of the lateral sides, the second lateral side being opposite the first lateral side, wherein the third and fourth power contacts are contiguous with the die carrier.

4. The power semiconductor package of claim 1, wherein the first side of the molded body is configured to be arranged over an application board.

5. The power semiconductor package of claim 1, wherein the second side of the molded body is configured to be coupled to a heatsink.

6. The power semiconductor package of claim 1, wherein the first and second control contacts are arranged between the first power contact and second power contact.

7. The power semiconductor package of claim 1, further comprising:

a third and a fourth power semiconductor die, wherein a first power electrode of the third power semiconductor die is electrically coupled to the first power contact by the first electrical connector and a first power electrode of the fourth power semiconductor die is electrically coupled to the second power contact by the second electrical connector.

8. The power semiconductor package of claim 7, wherein the first control contact is coupled to a gate electrode of the first power semiconductor die and to a gate electrode of the third power semiconductor die, and wherein the second control contact is coupled to a gate electrode of the second power semiconductor die and to a gate electrode of the fourth power semiconductor die.

9. The power semiconductor package of claim 7, further comprising:

a sensing contact arranged between the first and second control contacts, wherein the sensing contact is coupled to the first power electrode of the fourth power semiconductor die.

10. The power semiconductor package of claim 7, wherein in a projection from above the first side of the first and second power semiconductor dies, an entire length of the first electrical connector extends along a first straight line and an entire length of the second electrical connector extends along a second straight line, and wherein the first and second straight lines are parallel to each other.

11. The power semiconductor package of claim 1, wherein the first and second electrical connectors comprise one or more of wire bonds, ribbons, and contact clips.

12. A power semiconductor package, comprising:

a die carrier comprising a first side and an opposite second side;

a plurality of power semiconductor dies electrically coupled in parallel to each other by the die carrier, the power semiconductor dies each comprising a first power electrode on a first side and a second power electrode on an opposite second side, wherein the second power electrodes face the first side of the die carrier;

a molded body at least partially encapsulating the power semiconductor dies, the molded body comprising a first side, an opposite second side, and lateral sides connecting the first and second sides, wherein the second side of the die carrier is at least partially exposed from the second side of the molded body;

a first and a second power contact and a first and a second control contact, the first and second power contacts and the first and second control contacts arranged laterally next to each other and exposed from a first one of the lateral sides of the molded body, wherein the first power electrode of each of the power semiconductor dies is electrically coupled to the first or second power contact by an electrical connector, and wherein a width of each of the first and second power contacts is at least four times the width of each of the first and second control contacts.

13. The power semiconductor package of claim 12, wherein the power semiconductor dies are arranged on the die carrier in a symmetrical matrix.

14. A method for fabricating a power semiconductor package, the method comprising:

providing a die carrier comprising a first side and an opposite second side;

arranging at least a first and a second power semiconductor die over the die carrier, the first and second power semiconductor dies each comprising a first power electrode on a first side and a second power electrode on an opposite second side, such that the second power electrodes face the first side of the die carrier and are electrically coupled to the first side of the die carrier;

at least partially encapsulating the first and second power semiconductor dies in a molded body, the molded body comprising a first side, an opposite second side, and lateral sides connecting the first and second sides, such that the second side of the die carrier is at least partially exposed from the second side of the molded body;

providing a first and a second power contact and a first and a second control contact such that the first and second power contacts and the first and second control contacts are arranged laterally next to each other and such that the power first and second contacts and the first and second control contacts are exposed from a first one of the lateral sides of the molded body; and electrically coupling the first power electrode of the first power semiconductor die to the first power contact using a first electrical connector and electrically coupling the first power electrode of the second power semiconductor die to the second power contact using a second electrical connector, wherein a width of each of the first and second power contacts is at least four times the width of each of the first and second control contacts.

15. The method of claim 14, further comprising:

providing a third and a fourth power semiconductor die; and electrically coupling a first power electrode of the third power semiconductor die to the first power contact using the first electrical connector and electrically coupling a first power electrode of the fourth power semiconductor die to the second power contact using the second electrical connector.

16. The method of claim 14, wherein in a projection from above the first side of the power semiconductor dies, an entire length of the first electrical connector extends along a first straight line and an entire length of the second electrical connector extends along a second straight line, and wherein the first and second straight lines are parallel to each other.

17. The method of claim 14, further comprising:

providing a third and a fourth power contact exposed from the molded body at a second one of the lateral sides, the second lateral side being opposite the first lateral side, wherein the third and fourth power contacts are contiguous with the die carrier.

* * * * *